United States Patent [19]

Flanders

[11] Patent Number: 4,753,317

[45] Date of Patent: Jun. 28, 1988

[54] TRAPEZOIDAL LOUDSPEAKER ENCLOSURE

[76] Inventor: Andrew E. Flanders, 570 N. 10th Ave., Cornelius, Oreg. 97113

[21] Appl. No.: 80,846

[22] Filed: Aug. 3, 1987

[51] Int. Cl.[4] ................................................ H05K 5/00

[52] U.S. Cl. .................................... 181/144; 181/148; 181/153; 181/154; 181/199

[58] Field of Search ................................ 181/144–154, 181/199

[56] References Cited

U.S. PATENT DOCUMENTS

| | | | |
|---|---|---|---|
| 2,002,390 | 5/1935 | Crosley, Jr. et al | 181/144 X |
| 2,811,215 | 10/1957 | Rudd et al. | 181/154 |
| 4,509,184 | 4/1985 | Yanagawa | 181/144 X |

*Primary Examiner*—B. R. Fuller
*Attorney, Agent, or Firm*—Olson & Olson

[57] ABSTRACT

A loudspeaker enclosure is configured in trapezoidal shape, with one angular end wall supporting an electromagnetic or electrostatic loudspeaker of the type having both front and back acoustic waves, with the front of the loudspeaker registering with a front wave opening in the angular end wall and the back of the loudspeaker communicating through a transmission line cavity with an acoustic port in the opposite angular end wall. Said opposite angular end wall supports a tweeter spanning said acoustical port. The port is dimensioned larger than the tweeter to provide a port opening having a cross sectional area of about 0.5 to about 2.0 times the operative area of the loudspeaker, and the centerlines of propagation of sound waves from the front waves of the loudspeaker and port form an included angle of about 90°. A mounting base is configured to support the enclosure removably at the port end with the parallel sides extending vertically. A deflector is configured for mounting removably on the opposite, loudspeaker end for deflecting sound waves angularly downward to project father forward into a room. The enclosure may also be used in pairs disposed horizontally and spaced apart horizontally, either along a wall or facing angularly inward from opposite corners of a wall, to substantially fill the room uniformly with sound.

6 Claims, 2 Drawing Sheets

TRAPEZOIDAL LOUDSPEAKER ENCLOSURE

BACKGROUND OF THE INVENTION

This invention relates to loudspeakers, and more particularly to a novel loudspeaker enclosure by which to improve significantly the acoustic performance of electromagnetic or electrostatic drivers capable of producing front and back acoustic waves.

The trapezoidal loudspeaker enclosure of this invention functions in the manner of the loudspeaker enclosure disclosed in my earlier U.S. Pat. No. 4,593,784. However, the enclosure of this invention exhibits distinctive structural features which achieve comparable results of my earlier enclosure while offering much greater flexibility in mounting attitudes or position. In addition, the length of the acoustic transmission line of this invention may be abbreviated considerably as compared with my earlier enclosure, while extending the bass response by about one octave below the driver free-air resonance.

SUMMARY OF THE INVENTION

In its basic concept, the loudspeaker enclosure of this invention includes a hollow box of trapezoidal shape with one of the forwardly converging end walls having an opening registering with a loudspeaker or tweeter providing both front and back acoustic waves of bass and/or mid-range audio frequency and the opposite forwardly converging end wall having a port therein registering with a loudspeaker or tweeter providing only front acoustic waves of high audio frequencies, the port being larger than the associated loudspeaker and the uncovered cross sectional area of the port being about 0.5 to about 2.0 times the operative area of the first loudspeaker, the centerlines of propagation of sound waves from the first of the two loudspeakers forming an included angle of about 90° with respect to the port propagation, wherein the back side of the first loudspeaker communicates the back wave thereof via the back wave port through a cavity that functions in the manner of an acoustic transmission line.

It is the principal objective of this invention to provide a trapezoidal loudspeaker enclosure operative on the principle of my earlier U.S. Pat. No. 4,593,784 while exhibiting a greater degree of flexibility and versatility in modes of mounting attitudes.

Another objective of this invention is to provide a trapezoidal loudspeaker enclosure operative on a principle of my earlier U.S. Pat. No. 4,593,784 while allowing the length of the acoustical transmission line to be shortened considerably and also extending the bass response by about one octave below the driver free-air response.

Still another objective of this invention is to provide a trapezoidal loudspeaker enclosure with a mounting base by which the loudspeaker may be supported with the longitudinal dimension of the parallel sides extending vertically.

A further objective of this invention is to provide a trapezoidal loudspeaker enclosure with a sound deflector located removably at the driver end.

A still further objective of this invention is to provide a trapezoidal loudspeaker enclosure of simplified construction for economical manufacture.

The foregoing and other objects and advantages of this invention will appear from the following detailed description, taken in connection with the accompanying drawings of a preferred embodiment.

DESCRIPTION OF THE PREFERRED EMBODIMENT

Figure 1:
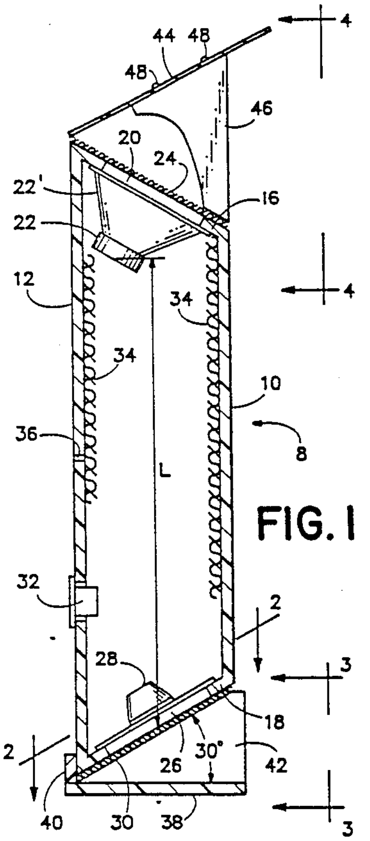
FIG. 1 is a longitudinal sectional view of a trapezoidal loudspeaker enclosure embodying the features of this invention.
Figure 2:
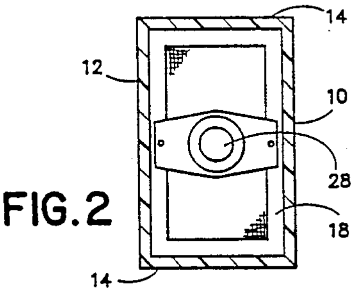
FIG. 2 is a sectional view taken on the line 2—2 in FIG. 1.

Referring primarily to FIG. 1 of the drawings, the trapezoidal loudspeaker enclosure of this invention includes a hollow box 8 of trapezoidal shape defined by a short front wall 10, a longer rear wall 12, a pair of side walls 14, and opposite, forwardly converging end walls 16 and 18.

An opening 20 in end wall 16 registers with the front side of a loudspeaker 22 which is characterized by providing both front and back acoustic waves of audio frequencies. The loudspeaker is supported by the box and registers with the opening 20 which preferably is covered by a decorative perforate cloth 24. In the preferred embodiment illustrated the loudspeaker is contained within the box and mounted on the end wall 16.

The end wall 18 is provided with a back wave port 26 a portion of which is spanned and therefore closed by second loudspeaker 28 which is characterized by providing only front acoustic waves of high audio frequency. This type of loudspeaker is commonly referred to as a tweeter. The outside surface of the end wall and port preferably is covered by decorative perforate cloth 30.

An electrical plug 32 is mounted in the rear wall 12 for convenience of making electrical connection to the loudspeakers 22 and 28. Carpet material or other acoustic filter material 34 is secured to the inner surfaces of the front and rear walls 10 and 12 to absorb certain of the high frequencies produced by the back wave of the loudspeaker 22 which are not desired to emanate from the port 26.

A dampening opening 36 is provided in one of the front and rear walls, preferably the rear wall 12 as shown, substantially centrally thereof and dimensioned emperically to effect conversion of the fundamental mode to near the second harmonic mode and thus eliminate undesirable resonance by dampening the bass at the fundamental "organ pipe" resonant mode of the transmission line which extends between the loudspeaker 22 and the port 26.

In this regard, the forward projecting acoustic wave of positive phase radiates in the normal manner through the opening 20 in the end wall 16 of the hollow box 8. However, the back wave of negative phase radiates into a cavity of specific size and proportions to offer an acoustic impedance substantially matching that of the loudspeaker 22. This cavity serves as an acoustic transmission line which is terminated in the port 26. The port is configured to have the same impedence as the loudspeaker 22, thereby "matching" the transmission line and re-radiating the back wave in a direction substantially normal to the front wave.

By avoiding enclosure dimensions whose cross sections in each direction are equal or simple multiples, the cavity is anti-resonant, as long as it is terminated properly.

In describing the propagation of sound as a spherical wave of intensity I, it behaves in accordance with the root-mean-square acoustic pressure p in its medium of travel with a density d and velocity of propagation c, such that $$I=p^2/dc$$

wherein the denominator product, dc, is the characteristic acoustic impedance of the medium, which is a constant for air. This characteristic acoustic impedance is analogous to electrical resistance in the well known equation for electrical power. Accordingly, the impedance Z of an acoustic transmission line is inversely proportional to its area for a given constant of proportionality K, in which $$Z=K/A$$

wherein A is the cross sectional area of the transmission line.

Thus, by making the cross sectional area of the transmission line substantially equal to that of the diaphragm 22' of the loudspeaker 22, a "match" is achieved wherein acoustic energy is efficiently transferred to the port 26 as a load, and little or no energy is reflected back to cause internal sound waves which adversely color the sound over the response band.

The degree of match that can be achieved as a practical consideration is seldom ideal, since round or oval shaped drivers are usually placed in rectangular boxes or enclosures. As with electrical systems, a square root of 2 relationship of driver area to that of transmission line and its port provides optimum power or energy transfer. However, the relationship may range between about 0.5 and 2.0 for satisfactory results in many instances.

The frequency response is largely determined by the driver characteristic and the apparent acoustic length L of the transmission line. The high frequency end may be extended beyond the capability of the driver 22 by incorporating a tweeter. The low end of response is basically determined either by the free air resonance of the driver 22 or the acoustic cut-off of the transmission line, as related to its length. Transmission lines of sufficient length L may extend the low frequency response below the free-air resonance as much as an octave. The cut-off frequency of the transmission line depends upon its acoustic length L with respect to the driver center. This length is theoretically ¼ wave length in air, and the frequency f for the wavelength λ in air with a propagation constant c is $$f=c/\lambda$$

As with organ pipes, the length of the acoustic transmission line is effectively extended from its port end by a portion of fhe equivalent diameter of the opening. Thus, with the driver 22 situated as close as possible to the closed end of the transmission line, the acoustic length approximates that of the enclosure by virtue of this "end effect" when suspended in free-air space. In addition, when placed near a wall, floor, or shelf, the transmission line is further extended effectively as the acoustic waves propagate along these exterior surfaces as though the enclosure were indeed physically longer. The combined extension is a geometrical consideration which is more significant for short or stubby transmission lines than for long ones. Stubby transmission lines have been previously observed with acoustic length about 50% greater than the physical length L from the center of the driver 22 to the edge of the port 26.

However, the trapezoidal port arrangement exhibits a sufficiently ideal termination that it can be very short with respect to a ¼ wavelength and effectively couple to the room or adjoining air mass. The physical length is constrained in shortness to about 2–4 times the effective diameter of the driver for a full octave extension below the free air resonance of the driver and about 1–2 times the effective diameter of the driver for less than one full octave extension below the free air resonance of the driver.

Locating the position for the dampening opening 36 is achieved by placing it at the approximate mid-point of the length of the transmission line, which is the position of maximum acoustic pressure of the fundamental mode, and by progressively increasing the size of the opening until substantially no air passage through the opening can be detected. For example, in a test unit an opening 36 of about ¼ inch exhibits substantial passage of air. However, when the opening is enlarged to about ⅜ inch, a nul is formed in acoustic pressure and the passage of air suddenly becomes almost undetectable. This reduced the slight coloration resonant rise from about 3 dB to an indiscernible level of about 0.5 dB.

The trapezoidal loudspeaker enclosure illustrated in FIG. 1 is open at both ends 16 and 18 by opening 20 and port 26, respectively. The end walls converge forwardly, preferably forming with the rear wall 12 an included angle of about 60°, such that the acoustic propagation of the front and back waves of the loudspeaker 22 proceeds substantially orthogonal with respect to each other, as in my earlier patent identified hereinbefore.

Figure 5:
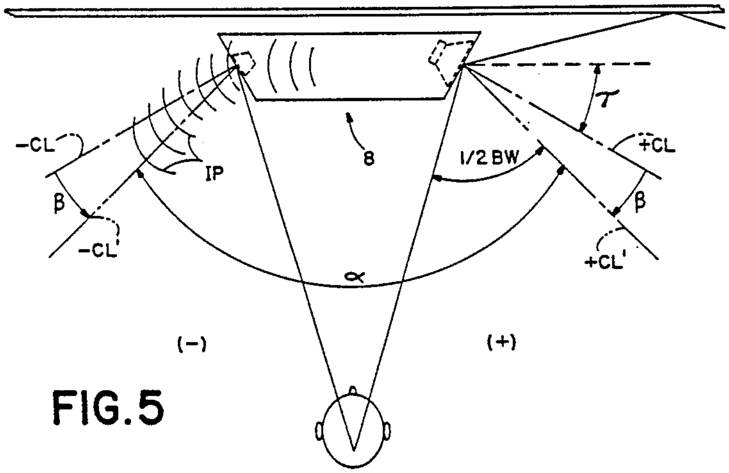
FIG. 5 is a fragmentary plan view illustrating graphically the sound propagation provided by the enclosure of FIG. 1 disposed in a horizontal position in a room the mounting base and sound deflector of FIG. 1 having been removed.

As shown in FIG. 5, the axis CL of the driver 22 is disposed by the angle $\tau$ from the longitudinal axis of the enclosusre. The port 26 is similarly disposed toward the opposite end of the trapezoid. As acoustic waves proceed toward the end of the transmission line L, the acoustic pressure is first reduced at the front of opening 26 adjoining side 10. The acoustic pressure is fully supported by the rear wall 12 and may also be effectively maintained in pressure by a nearby wall or other planar surface. This in effect causes a bending of the acoustic wave, as illustrated by the isopressure lines IP in FIG. 5. The resulting bending angle $\beta$ is observed to appear in the vacinity of 10° to 15° for the illustrated trapezoid angle of 30°. The centerline of propagation CL results in an inwardly disposed direction of about 45° from the horizontal axis. The included angle $\alpha$ thereby becomes approximately 90°.

Since the beam width of the forwardly directed sound field (+) of the driver 22 over much of the spectrum may be expected to fall around 120°, the half beam width, ½BW, of 60° when added to the propagation angle of about 45° results in a convergent sound field when combined with the rearward sound (−) from the port 26.

As previously discussed, the rearward sound of the driver 22 is acoustically filtered at 34 to remove the upper frequencies which would impart a "tunnel" effect to the port sound. The high frequencies are reconstructed by the tweeter 28 at the port opening 26. This provides full range sound at both ends. An observer a few meters or more from the enclosure will note a unique result. Since the ear is insensitive to acoustic polarity (+) or (−), excellent sound quality is heard from one end to the other providing an apparently uniform hemisphere of sound. This is indeed an uncommon result for a single driver and single tweeter. In the vertical plane, the sound field is considerably under 180°. However this would not be noticed in most situations of a listening room.

Another significant feature of this enclosure is the very short transmission line L that adequately loads the driver 22 to extend the bass response by about an octave. A stubby transmission line only about 3 times as long as the diameter of the driver 22 provides sufficient bass coupling to the room. Accordingly, small rooms in which the longer waves may not fit can limit the bass response independently of the enclosure. The balanced acoustic loading to the driver 22 is observed to frequently raise the upper limit of response also by nearly an octave. Therefore, a driver characterized by a free-air resonance of 60 Hz and an upper limit of 15 KHz may respond from 30 Hz to 30 KHz in a relatively small trapezoidal enclosure. A high performance tweeter provides similar response from the port 26.

Since the "matched" transmission line is non-resonant, the harmonics and fundamental of bass sounds are in their proper timing or phase relationship, giving crisp, vital, natural sounding bass. Resonant boxes such as bass reflex and air suspension enclosures necessarily, from systems theory, introduce a phase shift approaching 180° between the fundamental and upper harmonics. This results in "mushy" base devoid of punch and impact. Usually the mid-range and high frequencies are spatially separated, which in combination with electrical cross overs interjects phase anomalies over much of the remaining spectrum.

In the trapezoidal enclosure of this invention a single high-performance driver 22 covers the entire spectrum of most music without phase anomalies since a single, coaxial, colinear and coherent sound source with no electrical crossovers projects into the room on the positive polarity end (+).

The port end exhibits a few milliseconds in transit time delay from the rear of the driver 22 before projecting into the room, thereby precluding coherent and colinear characteristics. However, a coaxial presentation of sound is available with excellent clarity. The result is a uniquely clear and natural presentation of sound throughout the listening "hemisphere" of the enclosure.

Furthermore, the sound is observed "in-the-room" and not "in-the-box" as characterized by conventional enclosures. In the event a coaxial tweeter is selected for the driver 22, the fraction of a millisecond lead in phase of timing of propagation is hardly noticed for the upper frequencies. A substantially coherent presentation in clarity is observed, particularly if the upper response of the driver and the lower response of the tweeter gently roll off and overlap. With acoustic summation, a spacious dimension is heard without introducing amplitude or phase distortion as with electrical, or linear summation.

Figure 3:
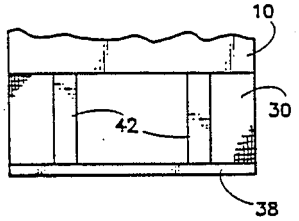
FIG. 3 is a sectional view taken on the line 3—3 in FIG. 1.

The trapezoidal enclosure may be positioned in an upright position, as illustrated in FIG. 1. For this purpose a detachable mounting bass is provided. As illustrated in FIGS. 1 and 3, the mounting base includes a mounting bass plate 38 provided at its rear end with a stop plate 40. A pair of laterally spaced upright wedge pieces 42 are secured to the bass plate and extend upwardly therefrom, diverging forwardly to maximum dimension. The slope of the upper surfaces of the wedge members correspond to the slope of the end wall 18 of the enclosure which, in the embodiment illustrated, is 30°. Accordingly, the enclosure box 8 is supported by the mounting base so that the longitudinal dimension of the parallel front and rear walls 10 and 12 of the enclosure box extend vertically. The outer surface of the rear wall 12 abuts the stop 40 to properly position the enclosure box on the mounting base.

The wedges 42 are spaced apart laterally to provide optimum support for the enclosure box and also to allow free egress of the high frequencies emanating from the port 26. The hard surface of the base plate 38 reflects the sound waves outward and generally upward, as illustrated in FIG. 6.

Similarly, the sound waves are reflected from immediately adjacent hard surfaces, such as the floor of a room or, if carpeted, from a small piece of acoustically hard material covering the carpet. The reflected high frequencies expand rapidly to fill the room. The mid and low frequencies of negative (−) phase are corner-coupled along the floor substantially in the manner of a horn.

Figure 6:
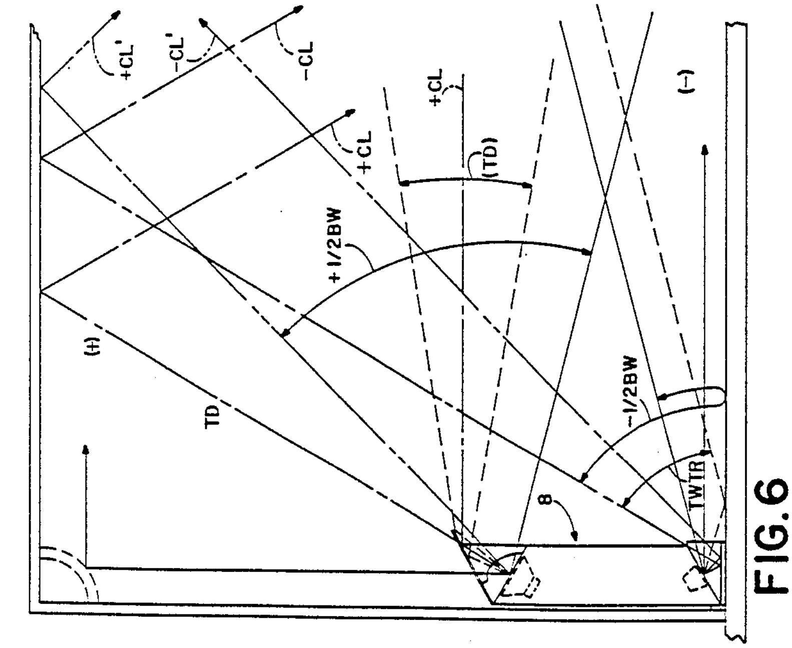
FIG. 6 is a fragmentary plan view illustrating graphically the sound propagation produced by the enclosure of FIG. 1 disposed in vertical position in a room.

The top, driver end 16 of the enclosure slopes downward and forward as shown in FIG. 6, with the wall effectively extending the enclosure as the sound "rolls" along the wall and rebounds from the corner. The orthogonal propagation between the positive (+) and negative (−) acoustic waves, are to be noted. As previously discussed, the sound bends sufficiently to give a convergent sound field to uniformly fill the room beyond a few meters from the enclosure.

It becomes readily apparent that the enclosure serves as a coupling device to excite the room as a tone chamber. The larger the room the more effectively the very low bass waves may be developed into the room before fold-back phase cancellation occurs. The low extreme of response is then limited by the octave extension of the enclosure to the driver free-air resonance.

The coherently projected upper harmonics and high frequencies of the driver tweeter dome TD reflect from the ceiling if a deflector is not used. This somewhat indirect presentation of the sound may be appropriately enjoyed in a small room with the listeners confined in close proximity to the enclosure. However, in large rooms, particularly with the sound stage located at the far end of the long dimension, a deflector advantageously reflects and redirects much of the high frequency energy (TD) in a horizontal direction to provide a more direct presentation with the auditory illusion of being closer.

Figure 4:
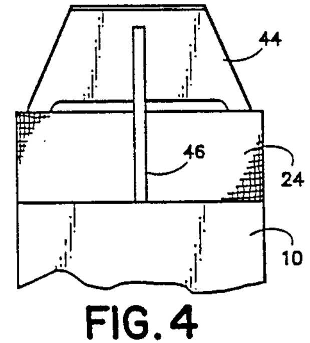
FIG. 4 is a fragmentary sectional view on the line 4—4 in FIG. 1.

For this purpose, and as best shown in FIGS. 1 and 4, a deflector plate 44 is provided with an elongated central support leg 46 secured thereto by such means as the screws 48. The support leg is configured to bear at its free end against the front end of the end wall 16 while the rear end of the deflector plate 44 bears against the upper, rear end of the end wall 18. In this position (FIG. 6) the deflector plate extends forwardly in an upwardly sloping direction to deflect much of the high frequency energy (TD) in a substantially horizontal direction.

Figure 7:
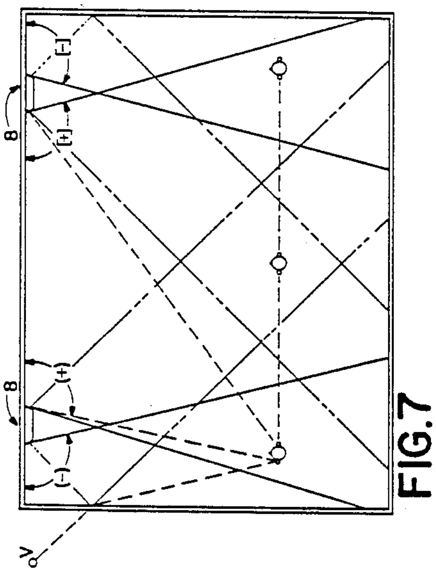
FIG. 7 is a plan view illustrating graphically the sound propagation produced by a pair of the enclosures of FIG. 5 disposed horizontally and spaced apart horizontally in a room.

As illustrated in FIG. 5, the horizontal attitude of the enclosure near a wall gives a hemispherical presentation to the sound throughout the listening planes. This offers a uniquely uniform stereo presentation throughout a room, as depicted in FIG. 7. The positive phase on the left (+) covers most of the room at a nearly uniform level beyond a few meters from the enclosure in rooms with moderate to live reverberation. The same is the case for the right [+] enclosure. The right an left coherent sound fields are heard by the listener throughout most of the room within the beam width boundaries.

This unique presentation of clearly projected sound is further enhanced by the left port (−) and right port [−] sound fields. These reflect from near the front corners, filling the small void of the positive sound fields, providing a substantially uniform stereo presentation throughout the room. In addition, the sound stage is somewhat expanded by the virtual image V presented to the outer ear from the oral image of the wall at a perceptible time delay in transit time for most situations.

Figure 8:
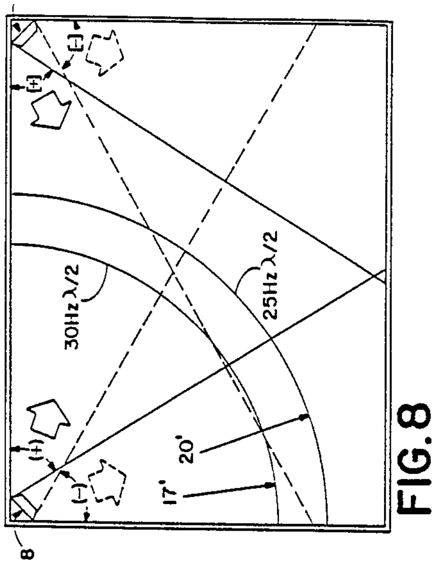
FIG. 8 is a plan view illustrating graphically the sound propagation produced by a pair of the enclosures of FIG. 5 disposed horizontally and facing angularly inward from opposite corners of a room.

The trapezoidal loudspeaker enclosure may be positioned across room corners, as illustrated in FIG. 8. It is to be noted from the sound field boundaries, complete stereo coverage of the room is achieved with only a modestly reduced coverage of the positive coherent field, left and right. Orthogonal projection of the forward left (+) and right [+] and rearward left (−) and right [−] sound fields is achieved as before.

Corner coupling with horn-like projection effeciency is realized for the lower frequencies in which the enclosure length is a small portion of the wavelength. In this configuration the acoustic analog of the enclosure to a push-pull electronic amplifier is quite evident. The positive acoustic wave projects along one wall while the negative wall projects along the other, usually at right angles.

The moderately convergent sound fields travel well beyond a $\lambda/2$ distance before overlap cancellation in acoustic pressures reduces the resultant sound by 3 dB or more. This is illustrated in FIG. 8 at 25 Hz and 30 Hz, respectively 20' and 17'. Accordingly, a strong bass response is realizable with a small coupling enclosure while utilizing the already existent large enclosure, i.e. the room, to enhance the bass.

The trapezoidal loudspeaker enclosure offers many attitude positions from which sound may be effectively projected. Thus, it may be placed upright on its mounting base; it may be hung or hard-mounted horizontally or vertically on a wall; it may be hung or hard-mounted from overhead; it may be laid horizontally on a shelf, table, stand or on top of a closet; it may be laid horizontally corner wise on a stand or end table; it may be hung horizontally corner wise in a room; it may be laid on its back on a stage apron, not requiring stage monitors for participants; and others as will be recognized.

To achieve full range sound from 30 Hz to 30,000 Hz with unprecedented clarity in a small, lightweight enclosure is a significant advancement in the art and science of sound projection. For example, a typical trapezoidal loudspeaker enclosure of this invention measures only 7 inches by 11 inches by 27 inches and weighs slightly under 20 pounds. Full loudness in the vacinity of 95 to 100 dB was achieved with orchestral sound material in a 50 foot by 75 foot gymnasium with only eight watts per channel or climaxes using 8 ohm drivers and piezo tweeters. Clear, crisp bass projection was achieved.

It will be apparent to those skilled in the art that various changes may be made in the size, shape, type, number and arrangement of parts described hereinbefore, without departing from the spirit of this invention and the scope of the appended claims.

I claim:

1. A loudspeaker enclosure comprising, in combination:

(a) a hollow box of trapezoidal shape having substantially parallel front and rear walls of which the front wall is shorter than the rear wall, parallel side walls and angular end walls converging toward the front wall and defining an interior, (b) a first loudspeaker mounted in the hollow box and characterized by providing both front and back acoustic waves of audio frequencies, (c) an opening in one of said end walls registering with one side of said first loudspeaker, (d) a port of a predetermined cross sectional area located in the end wall oposite said one end wall, and (e) a second loudspeaker mounted in the hollow box and spanning a portion of said port and characterized by providing only front acoustic waves of high audio frequencies, (f) the cross sectional area of the port uncovered by the second loudspeaker being about 0.5 to about 2.0 times the operative area of the first loudspeaker, (g) centerlines of propagation of sound waves from the front acoustic waves of the first and second loudspeakers forming an included angle of about 90°, (h) the interior of the hollow box between the first and second loudspeakers being proportioned and arranged to function as an acoustic transmission line which terminates in the port.

2. The combination of claim 1 wherein the included angle between each end wall and back wall is about 60°.

3. The combination of claim 1 including a dampening opening in one of the side walls of the hollow box substantially midway between the end walls and dimensioned to achieve substantially no passage of air therethrough upon operation of the first loudspeaker associated with the fundamental resonance of an air column formed by the hollow box, while contributing negligable loss at other frequencies.

4. The combination of claim 1 including a mounting base supporting the hollow box with the longitudinal dimension of the side walls extending substantially vertically.

5. The combination of claim 4 wherein the mounting base includes a base plate for support on a substantially horizontal plane, a pair of laterally spaced wedge members on the base plate configured to engage an end wall of the hollow box, and a stop member on the base plate configured to engage the rear wall of the hollow box.

6. The combination of claim 1 including a sound wave deflector configured for mounting on one end of the hollow box and to diverge forwardly from said one end.

* * * * *